(12) United States Patent
Morad (10) Patent No.: US 7,855,156 B2
(45) Date of Patent: Dec. 21, 2010

(54) METHOD OF AND APPARATUS FOR INLINE DEPOSITION OF MATERIALS ON A NON-PLANAR SURFACE

(75) Inventor: Ratson Morad, San Mateo County, CA (US)

(73) Assignee: Solyndra, Inc., Santa Clara, CA (US)

( * ) Notice: Subject to any disclaimer, the term of this patent is extended or adjusted under 35 U.S.C. 154(b) by 636 days.

(21) Appl. No.: 11/801,723

(22) Filed: May 9, 2007

(65) Prior Publication Data

US 2008/0276451 A1 Nov. 13, 2008

(51) Int. Cl.
*H01L 21/00* (2006.01)

(52) U.S. Cl. .............. 438/798; 438/800; 257/E21.461; 257/E21.476

(58) Field of Classification Search ............... 438/795, 438/800, 584, 798, FOR. 385, FOR. 391; 257/E21.461, E21.476; 204/297.01, 298.23, 204/298.27, 298.28; 118/500, 730
See application file for complete search history.

(56) References Cited

U.S. PATENT DOCUMENTS

| | | | |
|---|---|---|---|
| 4,223,667 A | 9/1980 | Paymal | |
| 4,225,638 A | 9/1980 | Waugh | |
| 4,451,507 A | 5/1984 | Beltz et al. | |
| 4,620,985 A | 11/1986 | Goodburn et al. | |
| 4,851,095 A | 7/1989 | Scobey et al. | |
| 5,055,036 A | 10/1991 | Asano et al. | 432/5 |
| 5,215,420 A * | 6/1993 | Hughes et al. | 414/217 |
| 5,356,261 A | 10/1994 | Nishi | 414/744.7 |
| 5,373,839 A | 12/1994 | Hoang | |
| 5,588,996 A | 12/1996 | Costello | |
| 5,611,861 A | 3/1997 | Higashi | 118/719 |
| 5,705,321 A | 1/1998 | Brueck et al. | 430/316 |
| 6,018,383 A | 1/2000 | Dunn et al. | |
| 6,079,693 A | 6/2000 | Ettinger et al. | 251/195 |
| 6,431,320 B1 | 8/2002 | Nichols | 187/263 |
| 6,435,868 B2 | 8/2002 | White et al. | 432/247 |
| 6,460,369 B2 | 10/2002 | Hosokawa | 62/378 |
| 6,499,426 B1 | 12/2002 | Windischmann et al. | 118/723 |
| 6,662,673 B1 | 12/2003 | Olgado | 74/490.01 |
| 6,681,716 B2 | 1/2004 | Schaepkens | 118/723 |
| 2001/0001407 A1 | 5/2001 | You et al. | 156/166 |
| 2001/0015074 A1* | 8/2001 | Hosokawa | 62/378 |
| 2002/0083739 A1 | 7/2002 | Pandelisev | |
| 2003/0154923 A1* | 8/2003 | Cheung | 118/729 |
| 2004/0231759 A1 | 11/2004 | Kobayashi et al. | 148/562 |
| 2006/0201074 A1 | 9/2006 | Kurita et al. | 52/79.1 |

* cited by examiner

*Primary Examiner*—Matthew S Smith
*Assistant Examiner*—Quovaunda Jefferson
(74) *Attorney, Agent, or Firm*—Haverstock & Owens LLP (57) ABSTRACT

In manufacturing a semiconductor device, a first chamber is provided. An opening couples the first chamber to a first environment through which at least one substrate can pass. A first seal environmentally isolates the first chamber from the first environment. A process chamber is coupled to the first chamber. Another seal environmental isolates the first and the process chambers. The substrate is placed within the first chamber, and the first chamber and the outside environment are isolated. The second opening is opened, and the substrate moves into the semiconductor process chamber. The first chamber is again environmentally isolated from the second volume. A semiconductor processing step is performed on the substrate within the processing chamber. While the substrate is processed, the substrate is rotated and translated through the processing chamber.

48 Claims, 11 Drawing Sheets

METHOD OF AND APPARATUS FOR INLINE DEPOSITION OF MATERIALS ON A NON-PLANAR SURFACE

FIELD

The present disclosure is related to semiconductor processing apparatus and techniques. Specifically, the present invention is directed to commercial semiconductor processing on non-planar surfaces using both translational and rotational movements.

BACKGROUND

In many conventional semiconductor processing technologies, the end product is a semiconductor device. This device is conventionally characterized as an essentially flat wafer in its width and length dimensions and having layered properties in the height dimension. Accordingly the specific processing steps used to make these planar devices are typically performed using planar or linear motions. In this manner, most conventional semiconductor processing machinery employs solely planar motion (movement in the width and length) to make these integrated circuits (ICs).

In building the material up on a substrate in a conventional planar IC, such planar motions are employed to translate the substrate through an inline process. Further, great care is taken to ensure that material deposition only occurs in one height direction and on one surface of the IC.

In this manner, semiconductor processing steps can be performed on an assembly line basis with the various devices and/or substrates being translated through the various pieces of semiconductor machinery. As described herein, such semiconductor processing steps can include deposition steps such as physical deposition, chemical deposition, reactive sputtering deposition, or molecular beam epitaxy deposition. All variants of the preceding deposition families should be considered as such semiconductor processing steps.

It should be understood that these semiconductor techniques described are all well known and performed on a common basis with regards to semiconductor devices having planar features. Accordingly, the various layers that are created on the planar substrate and/or IC can be created easily, cheaply, and in a timely manner, but only if the corresponding semiconductor device is planar in nature.

Conversely, in current conventional practice, semiconductor manufacturing techniques and/or processing steps, such as deposition, evaporation, and scribing, although well known, are typically limited to operating on these substantially planar substrates. Further, conventional practice is typically limited to processing machinery that operates in such a linear or planar fashion.

Figure 1A:
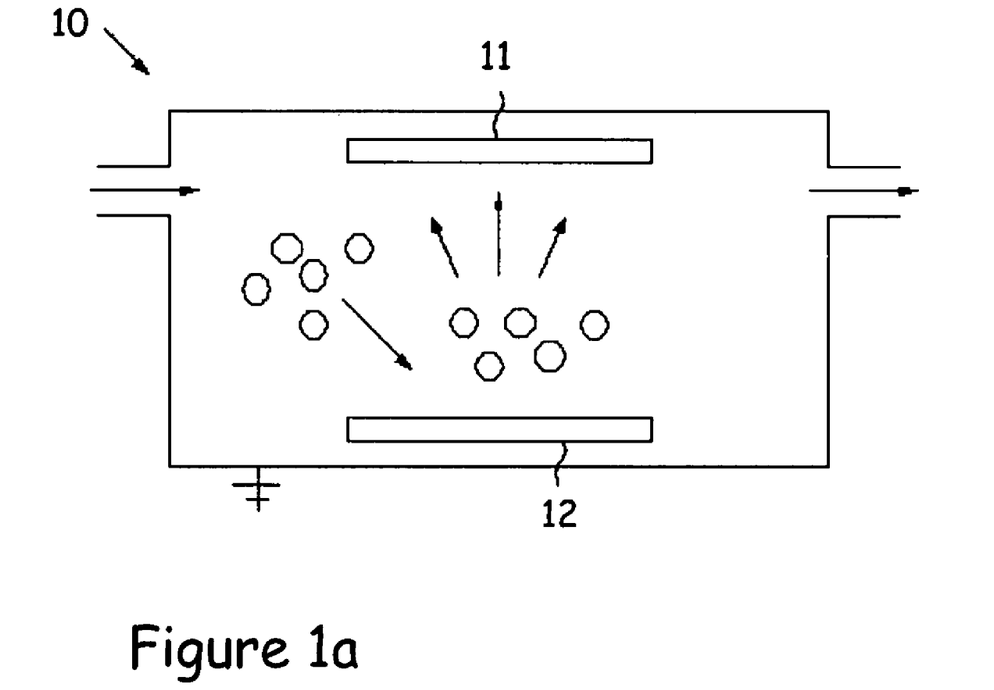
FIG. 1A shows a conventional sputter chamber for deposition of materials on a substantially planar semiconductor substrate.

For example, FIG. 1A shows an exemplary conventional sputter deposition chamber 10. Sputter deposition is a method of depositing thin films onto a substrate 11 by sputtering a block of source material 12 onto the substrate 11. Sputter deposition typically takes place in a vacuum. Sputtered atoms ejected into the gas phase are not in their thermodynamic equilibrium state, and tend to deposit on all surfaces in the vacuum chamber. A substrate (such as a wafer) placed in the chamber will be coated with a thin film of the source material 12. Sputtering typically takes place with argon plasma, or another inert gas in a plasma state, as well as the target material (i.e. a semiconductive material, a metallic material, or a buffer material.)

Figure 1B:
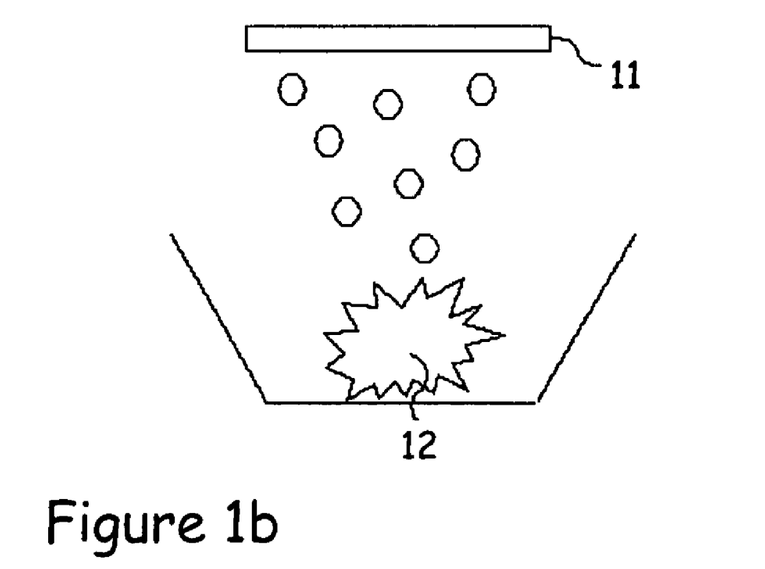
FIG. 1B shows a conventional evaporation deposition chamber.

Another common method of deposition is evaporation deposition, as described with respect to FIG. 1B. The source material 12 is exposed to a high temperature such that the material is evaporated. This can take place in a vacuum, which more easily allows vapor particles to travel directly to the target substrate, where they condense back to a solid state.

The construction of a non-planar shaped device would be problematic using planar- or linear-based manufacturing devices. For example, if one wished to create a light-emitting diode on a tube (ostensibly to make a light source), such planar- or linear-oriented manufacturing devices would make its manufacture problematic (at the least). One solution to this problem of manufacturing semiconductors on non-planar substrates can be found in U.S. Patent Application No. 60/922,290 entitled "Method Of Depositing Materials On A Non-Planar Surface", filed on Apr. 5, 2007.

Further, producing non-planar ICs in commercial quantities would be difficult, and not just due the problems inherent in these alternative manufacturing geometries. One would also have to scale to produce the alternative geometries in numbers in an efficient manner.

In the use of some conventional manufacturing technologies, the substrates are typically inserted into the semiconductor manufacturing system to be processed. However, when the semiconductor manufacturing system is opened, the external environment floods into the processing area or the processing chamber. After the manufacturing system is opened, the substrates are loaded into the semiconductor manufacturing system, and the environment within the processing volume of the semiconductor manufacturing system can be altered to match the needed processing environment. At the end of all these steps, the processing of the substrates is started. However, the replacement of the environment with the processing environment in such alternative geometry processing systems could take a significant amount of time, thus decreasing the overall effectiveness and efficiency of the semiconductor manufacturing system.

BRIEF DESCRIPTION OF THE SEVERAL VIEWS OF THE DRAWINGS

The accompanying drawings, which are incorporated into and constitute a part of this specification, illustrate one or more embodiments of the present invention and, together with the detailed description, serve to explain the principles and implementations of the invention.

DETAILED DESCRIPTION

Methods and apparatuses directed to inline deposition of semiconductor materials and other materials in the manufacture of semiconductor devices on non-planar surfaces are described herein. In this specification and claims, the term "substrate" can refer to an actual base upon which materials common to semiconductor manufacturing are deposited, or a partially built-up device already having one or more materials already deposited. In this specification and claims, the term "non-planar" can refer to any substrate that is not substantially planar in construction (i.e. one that does not lie essentially in a two dimensional, substantially relatively flat surface).

Examples of non-planar surfaces include surfaces having an arcuate feature, a curved feature, or surfaces having more than one planar surface conjoined in differing two-dimensional planes. Such non-planar surfaces can include "open surfaces" (i.e. "sheets"), or "closed surfaces" (i.e. rods, tubes, among others.) Such closed surfaces be solid in nature (i.e. rods), hollow (i.e. tubes), and can include those surfaces having indentations (i.e. cylinders.) The closed surfaces can be of any cross-sectional geometry, and such cross-section can include curved features, arcuate features, linear features, or any combination thereof. The cross-sectional geometry can include curved or arcuate geometries (i.e. circles and ovals), or any linear geometry (squares, rectangles, quadrilaterals, triangles, or any n-faced geometry, regular and irregular.) The previous examples of non-planar geometries are exemplary in nature, and the reader will note that many differing non-planar geometries are possible and should be considered as part of this specification. The shapes are able to be circular, ovoid, or any shape characterized by one or more smooth curved surfaces, or any splice of smooth curved surfaces. The shapes are also able to be linear in nature, including triangular, rectangular, pentangular, hexagonal, or having any number of linear segmented surfaces. Or, the cross-section is able to be bounded by any combination of linear surfaces, arcuate surfaces, or curved surfaces.

The present disclosure will be described relative to semiconductor deposition on tubular substrates. However, it will be apparent to one of ordinary skill in the art that teachings of this disclosure are able to be directly applied to the deposition of other types of useful materials on a wide variety of non-planar surfaces. Moreover, while the teachings herein are directed towards semiconductor deposition, it will be apparent to one of ordinary skill in the art that teachings of this invention are able to be directly applied to technologies requiring deposition of materials on a variety of non-planar surfaces including, but not limited to, manufacture of non-planar photovoltaic cells, non-planar LEDs, and the like. The following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The drawings may not be to scale. The same reference indicators will be used throughout the drawings and the following detailed description to refer to identical or like elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application, safety regulations and business related constraints, and that these specific goals will vary from one implementation to another and from one developer to another. Moreover, it will be appreciated that such a development effort will be a routine undertaking of engineering for those of ordinary skill in the art having the benefit of this disclosure.

Figure 2A:
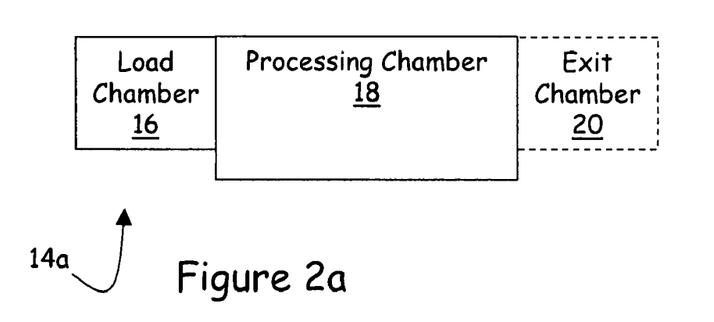
FIG. 2A is a side functional diagram of a semiconductor processing apparatus associated with a load chamber and an optional exit chamber.
Figure 2B:
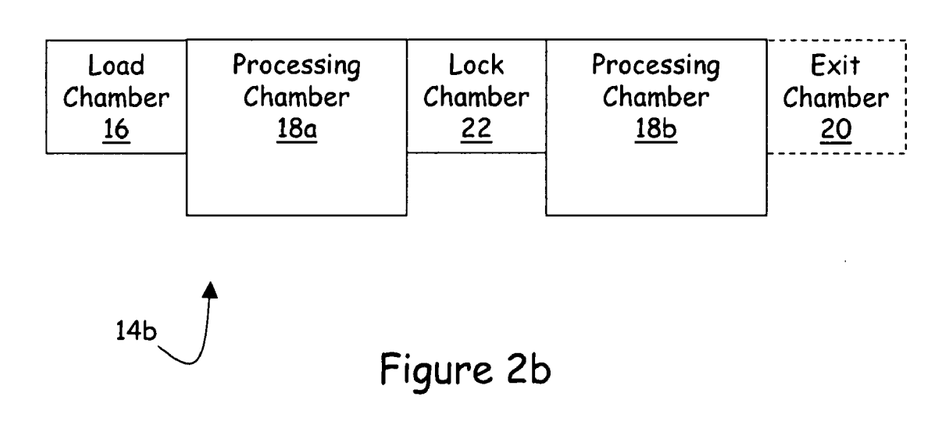
FIG. 2B is a side functional diagram of a semiconductor processing apparatus associated with a load chamber, an intermediate chamber, and an optional exit chamber.

FIGS. 2a and 2b are exemplary embodiments of a semiconductor deposition system that is suited for inline and continuous production of semiconductors having non-planar geometries. In a semiconductor processing system 14a, a load chamber 16 is provided that has environmental seals to the external environment and to a processing chamber 18. The load chamber 16 is environmentally sealed from the processing chamber 18, and then opened to the external environment. The substrates are initially loaded into the load chamber 16, and the load chamber 16 with the substrates is then sealed from the external environment. The environment of the load chamber 16 is can be matched to the environment of the processing chamber 18. The environmental seal between the load chamber 16 and the processing chamber 18 is opened.

The substrates then transition to the processing chamber 18, and the load chamber 16 can be environmentally sealed from the processing chamber 18. Within the processing chamber 18, a semiconductor processing step is performed on the substrates. An optional exit chamber 20 is shown, where the exit chamber 20 has an environmental seal opening to the processing chamber 18 and an environmental seal opening to an outside environment. When the processing is finished on the substrates, the environmental seal between the exit chamber 20 and the processing chamber 18 is opened and the substrates can then transition into the exit chamber 20. When the substrates are in the exit chamber 20, the environmental seal between the processing chamber 18 and the exit chamber 20 is closed, thus isolating the environment within the processing chamber 18. At this point, the outer seal on the exit chamber 20 is opened, and the substrates can transition out of the exit chamber 20.

It should be noted that the load chamber 16 can be concurrently reloaded with another load of substrates when the first set of substrates transitions into the processing chamber 18. In this manner a continual cycle of processing can be performed on substrates with the processing system 18.

FIG. 2b details another exemplar processing system. In this system, the processing is expanded to a plurality of processing chambers 18a-b. An intermediate lock chamber 22 acts as an environmental buffer between the processing chamber 18a and the processing chamber 18b in much the same manner as the load chamber 16 acts as an environmental buffer between an external environment and the environment within the processing chamber 18 in FIG. 2a.

It should be noted that the volumes of the load chamber 16, the lock chamber 22, and/or the exit chamber 20 can be substantially less than the volumes of the processing chambers. In this manner, the need to evacuate the processing chamber prior to processing and then re-establishing an appropriate environment in the particular processing chamber is eliminated.

The exemplary processing chamber in this example can be a sputter deposition system, a reactive sputter deposition system, an evaporation deposition system or any combination thereof, where the system has at least one chamber where material is deposited on a substrate and at least one target deposition material. Alternatively, the exemplary processing chamber can be any chamber useful for depositing or growing thin films on a substrate. The atmosphere within the processing chamber can be of any sort that enables the semiconductor process, including a wide range of temperatures, wide ranges of pressures, and wide ranges of chemistries (including a lack of atmosphere as might be common in a true vacuum chamber.)

Figure 3:
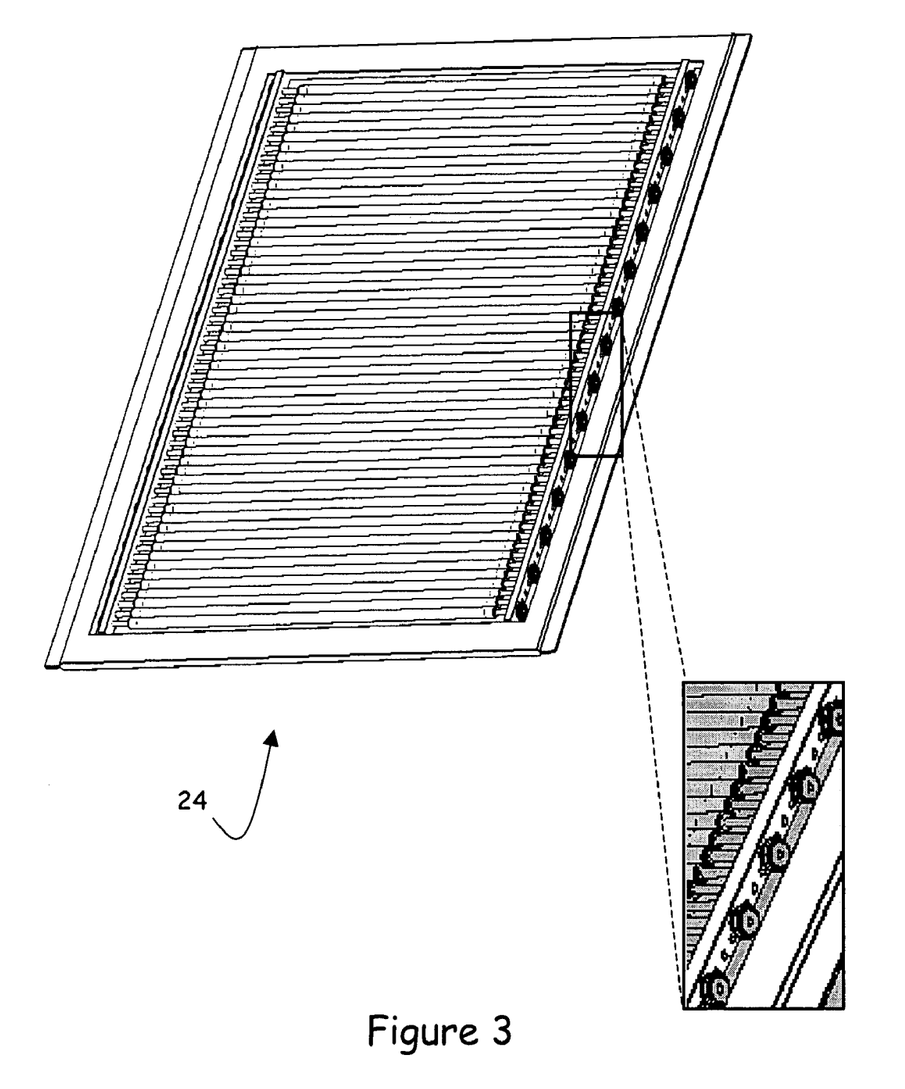
FIG. 3 shows an example of non-planar substrates per the instant disclosure along with an exemplary tray used in the processing

FIG. 3 is a perspective view of a load tray that could be employed with the present disclosure. The elongated substrates in this embodiment are loaded into a tray such that longitudinal axes of the elongated substrates are perpendicular to the inline motion of the tray. This tray could be placed into the load chamber, and the load chamber need only be slightly larger than the tray itself. Given that an inline processing area could be many multiples of the length of the tray, many multiples the height of the tray, and at least the width of the tray (if not more), the volume associated with the load chamber need only be a small fraction of the volume of the inline processing chamber.

The blowup in FIG. 3 details a tray with a set of rollers associated with the frame. The rollers can be coupled to members that are in turn coupled to the elongated substrates. In one instance, the rollers can contact a surface of the processing chamber. When this occurs, the contact between the rollers and the surface, along with the translational force provided by the tray, causes the rollers to turn. Thus, when the tray is transported via a translational motion, the rollers will rotate, and thus rotate the elongated substrates.

Figure 4:
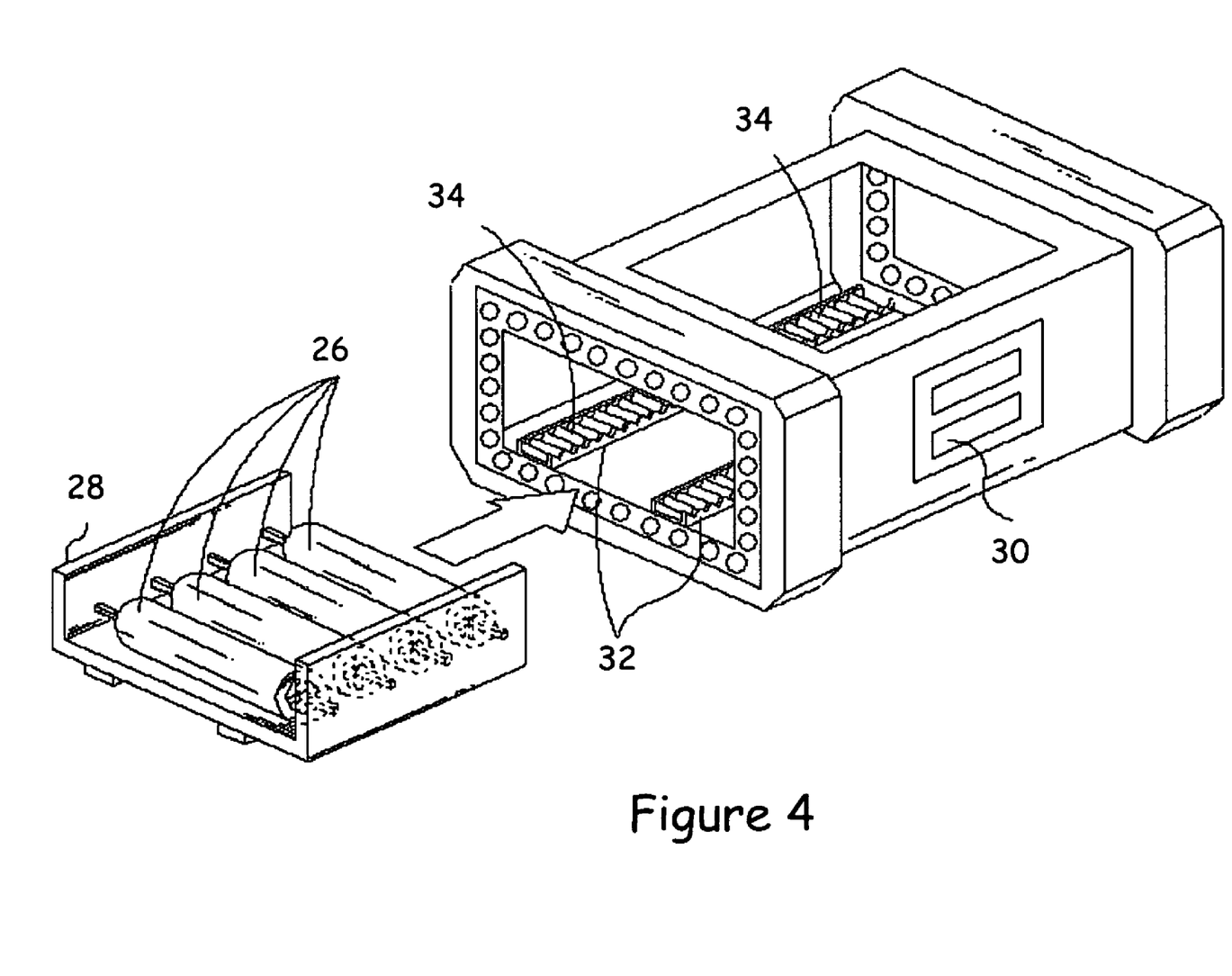
FIG. 4 shows an example of non-planar substrates being loaded into a processing chamber per the instant disclosure.

FIG. 4 is a perspective diagram of a substrate tray being loaded into a load chamber. In this diagram the non-planar substrates 26 are shown loaded onto a tray 28 for processing. The tray and associated substrates are to be loaded into an exemplary load chamber 30, which is associated with a chambered processing system. In some embodiments, the non-planar substrates 26 are fixed with the tray 28 such that a surface of the non-planar substrates are elevated from the top surface of the tray 28. Of course, the top surfaces of the substrates need not be elevated above the top surface of the tray. The top surface of the tray may be above the top surface of any substrate, below the top surface of any substrate, or coincide with the top surface of any substrate. Of course, the substrates could also have any number of any orientations with respect to the top level of the tray in combination with any number with another orientation with the top level of the tray.

In some embodiments, the chambered processing system and/or load chamber has ingress and an egress, where the path between the ingress and egress determines a translational path down which the non-planar substrates 26 travel. In some embodiments, as the tray 28 enters and translates through the deposition chamber, the non-planar substrates 26 are rotated along their longitudinal axes. In this manner, the outside surfaces of the substrates 26 are exposed to the particular semiconductor process.

It should be noted that the intermediate lock chamber and the exit chamber have similar functionality. Accordingly the descriptions contained within this document that refer to a load chamber may be applied with equal clarity to the intermediate lock chamber and/or the exit chamber.

The translation motion through the load chamber and/or deposition chamber can be effectuated by, for example, a linear drive mechanism 32. However, any means may be used to effectuate translational motion of the substrate(s) through the processing system. The linear drive mechanism could have matching teeth 34, that would help effectuate a rotation of the elongated substrates in one embodiment contemplated In one embodiment, the trays are able to be magnetically coupled to the linear drive mechanism. In this case they do not physically contact the deposition chamber, which may result in enhanced uniform deposition.

Figure 5:
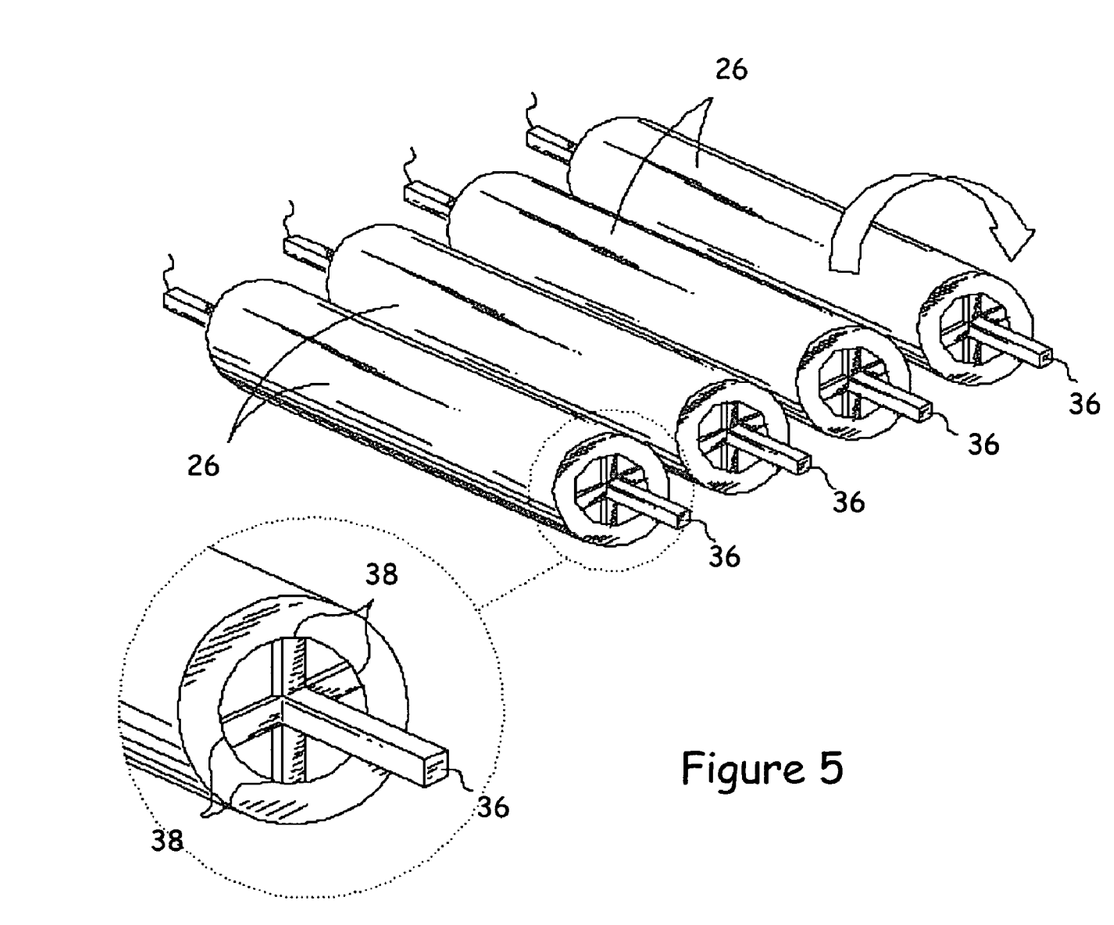
FIGS. 5 and 6 show exemplary means for rotation per the instant disclosure.

FIG. 5 shows an example of a method and/or apparatus for depositing semiconductor materials on non-planar substrates. A non-planar substrate 26 is characterized by a cross-section bounded by any one of a number of shapes. As described herein, for ease of discussion only, a circular cross-section is described in this description, but any non-planar geometry may be used. In this embodiment, the non-planar substrate 26 is hollow within its body, or has an indentation. Each non-planar substrate 26 is fitted with at least one mandrel 36. The mandrels 36 are inserted into the hollow portion or the indentation of the non-planar substrates 26. In some embodiments, the mandrels 36 couple within the hollow portion of the non-planar substrates 26 such that contact loci 38 between the mandrel 36 and the non-planar substrates 26 maintain sufficient contact and effectuate sufficient torque to allow for a rotation of the non-planar substrates 26 along a longitudinal axis without unwanted slippage, which could causing undesired or unplanned rotation. As the mandrels rotate, the substrates 26 also rotate. The contacting surface of the mandrels may be smooth. In one case, the hollow or indented feature of the mandrels might have a pattern associated with it, and the mandrel might have a "locking" pattern associated with it. In this example, the substrate and the mandrel may be "mated". One example of a locking pattern would be an example of any number of "gear teeth" associated with a matched gear-tooth feature that would accomplish this locking. In another embodiment, the substrates could have a "cup" fitted over one or more ends. The cup is attached to a rotating member. When the rotating member rotates, the cup would apply rotational force to the outside of the substrate, in turn rotating the substrate.

Figure 6:
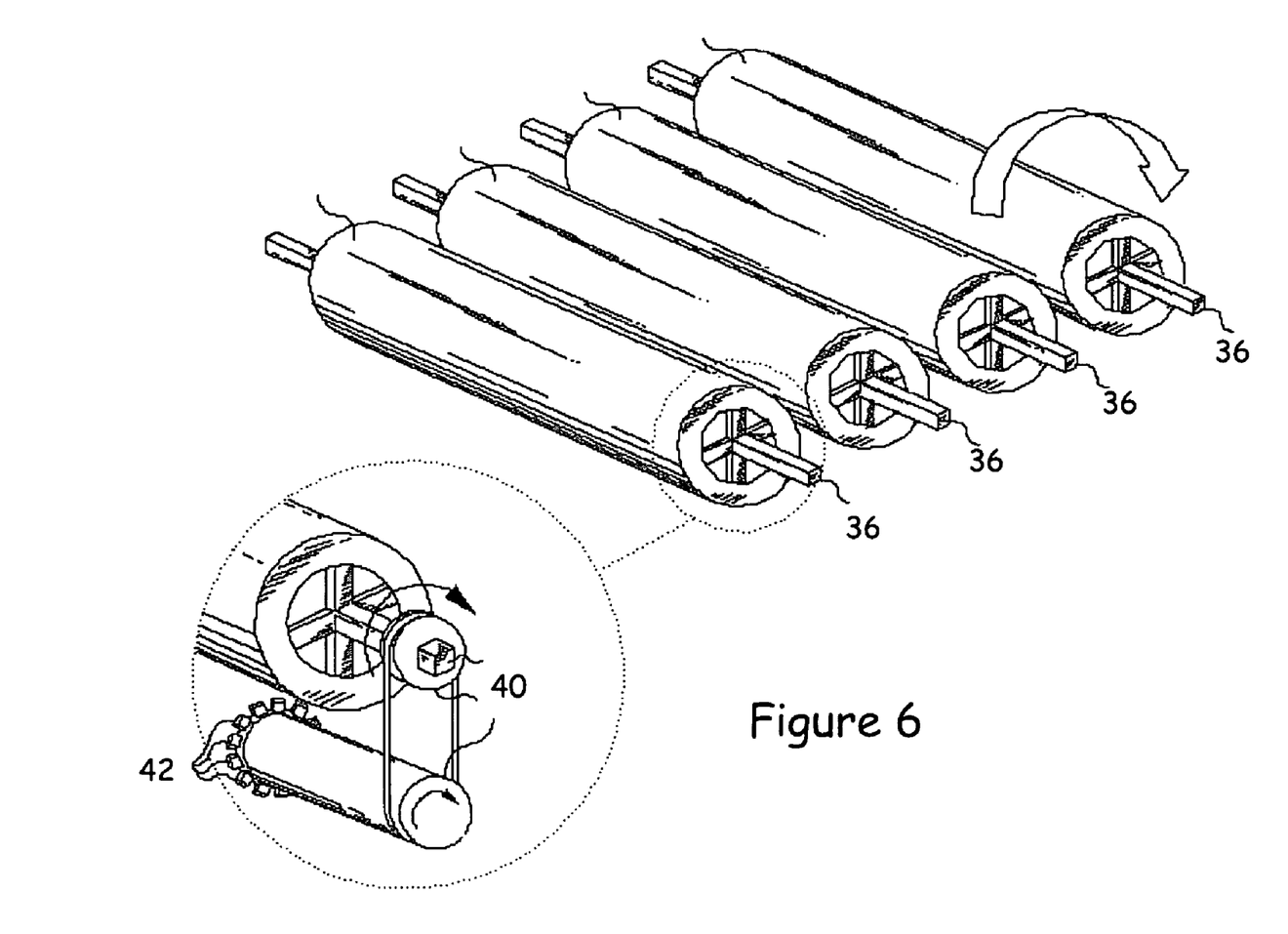

FIG. 6 shows an exemplary embodiment of a rotation mechanism for rotating the non-planar substrates as they translate down or through the lock chamber and/or a processing chamber. In this exemplary embodiment, a gear and pulley system 40 is operatively coupled to the mandrel 36. In some embodiments, the gear and pulley system comprises teeth 42. As previously described, the linear drive mechanism has matching teeth. In some embodiments, as the tray continues in the translational direction, the teeth 42 on the gear and pulley system 40 mesh with the matching teeth in the linear drive mechanism, enabling the gear and pulley system 40 to rotate the non-planar substrates when being translated through the processing chamber. Such rotation enables the processing step to be performed over the surface areas of the non-planar substrates, up to and including the entirety of the surface area. Any predetermined portion of the surface area of the non-planar substrates is able to be exposed to the processing step. In a further alternative embodiment, any predetermined pattern is able to be deposited on the surface area. Further by way of example, in another embodiment, the teeth 42 are able to be affixed to the mandrel 36.

In another embodiment, dual sets of gear pulley systems may be used. Such use need not be limited to driving not just a single mandrel, but numerous mandrels at the same time. Or, a magnetic system can be used to accomplish the rotation. In this embodiment, the force used to power the rotation mechanism comes not from a physically linked source such as the gear pulley system described. The mandrels may be physically linked to a magnetic material. External magnets can be provided and rotated, thus imparting the rotation of the external magnets to the magnetic material through an associated magnetic field, where the rotation is physically imparted to the mandrel and the substrates. Accordingly, it can be appreciated by those of ordinary skill in the art that other alternative means or methods of rotation are able to be incorporated herein to achieve the end result of rotating the non-planar substrates during the translational motion through the chamber. This disclosure should be read to include those types of mechanisms to impart such a rotation to the substrates.

Figure 7:
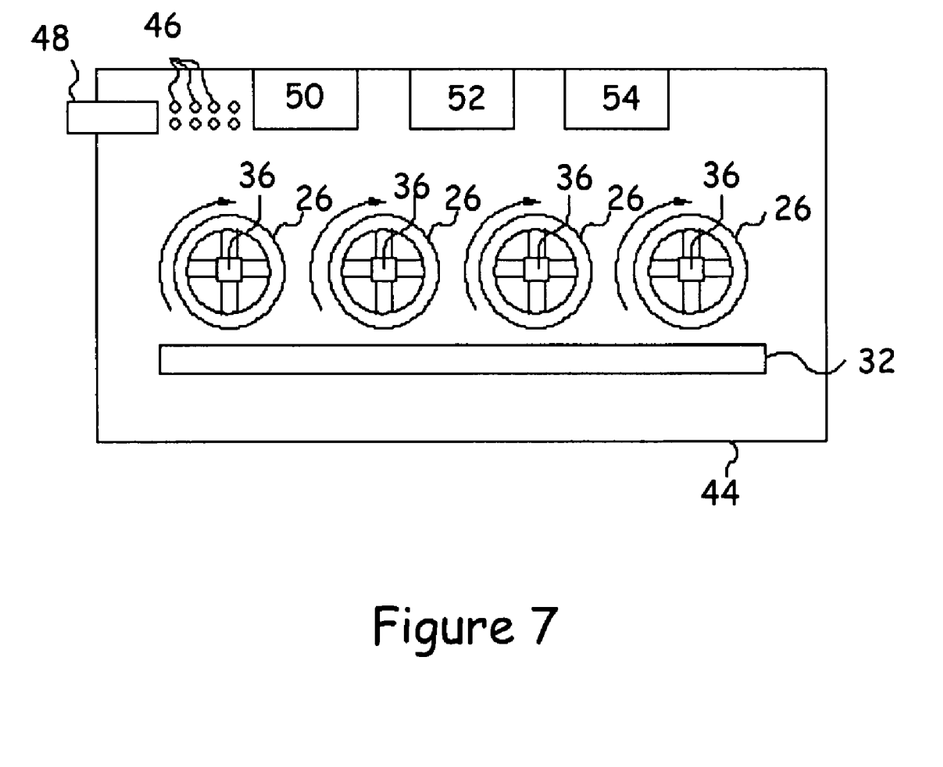
FIG. 7 shows an exemplary cross section of a processing chamber with the non-planar substrates rotating while concurrently being moved down a translational path.

FIG. 7 shows an exemplary cross section of a deposition chamber that might employ such lock systems and rotational systems. By way of example, a chamber 44 is the first chamber of a Copper Indium Gallium Selenide (CIGS) sputter system. An inert plasma gas such as argon 46 is fired into the chamber 44 via an intake 48. Upon entering the chamber, the plasma gas molecules 46 collide with one or more sputtering targets 50-54. By way of example, the sputter targets 50, 52, and 54 are selenium, copper and gallium respectively. As the inert plasma gas 46 bombards the targets 50, 52, and 54, molecules of the target materials leave thermal equilibrium and begin coating all surfaces within the chamber 44. In some embodiments, the non-planar substrates 26 continue rotating about their longitudinal axes as they translate through the chamber 44, such that their outer surface areas will be coated by the molecules of the sputtering targets 50, 52, and 54. The rate of rotation through as well as the rate of translation within the chamber 44 are able to be predetermined as functions of the sputtering target materials, the ambient temperature, the temperature and kinetic energy of the plasma gas 46, and the desired thickness of the coating upon non-planar substrates, among other factors. It should be noted that the source materials need not be isolated from one another, whatever the deposition step variety, and that the sources may be combined.

Control and measurement systems can be used to manage and control the rates of translation and rotation. The rates can be constant, or dynamic. The relationship between the rate of translation and a rate of rotation can be fixed, such as depicted in the system employing the gear-pulley system. The relationship between the rate of translation and rotation can be varied and/or controlled, such as varying the rate of rotation in the magnetically coupled system. The rate of translation and the rate of rotation can be coupled or can be independent. When each substrate is individually rotated, the rates between differing substrates can be the same of different. The rotation can be analog in nature, or can occur in discrete steps. The translation can be analog in nature, or occur in discrete steps. Further, both the rotation and the translation can occur individually as analog, individually as discrete steps, or in varying combinations.

Figure 8A:
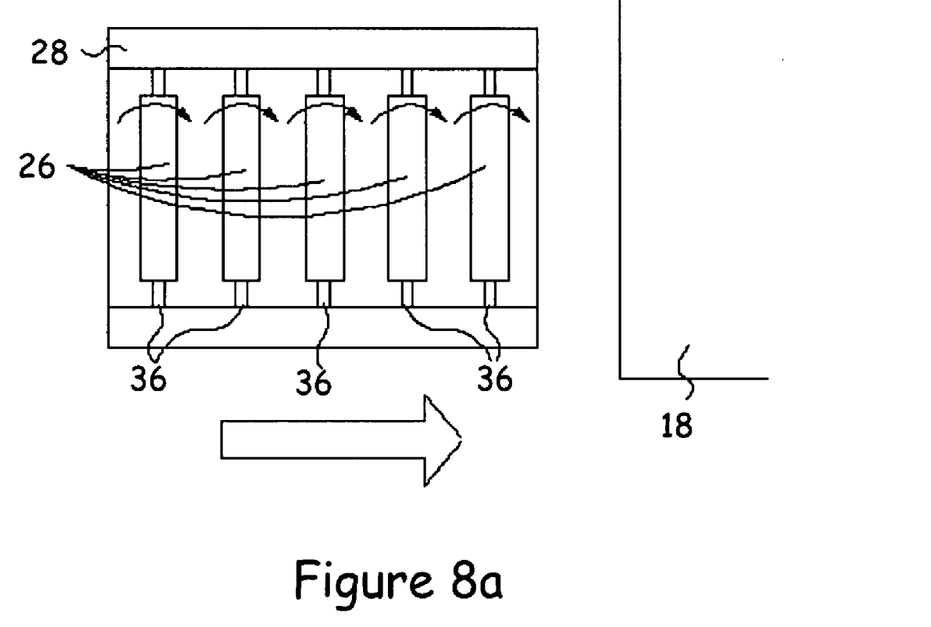
FIG. 8A shows an exemplary combination of rotation and translation of the non-planar substrates.
Figure 8B:
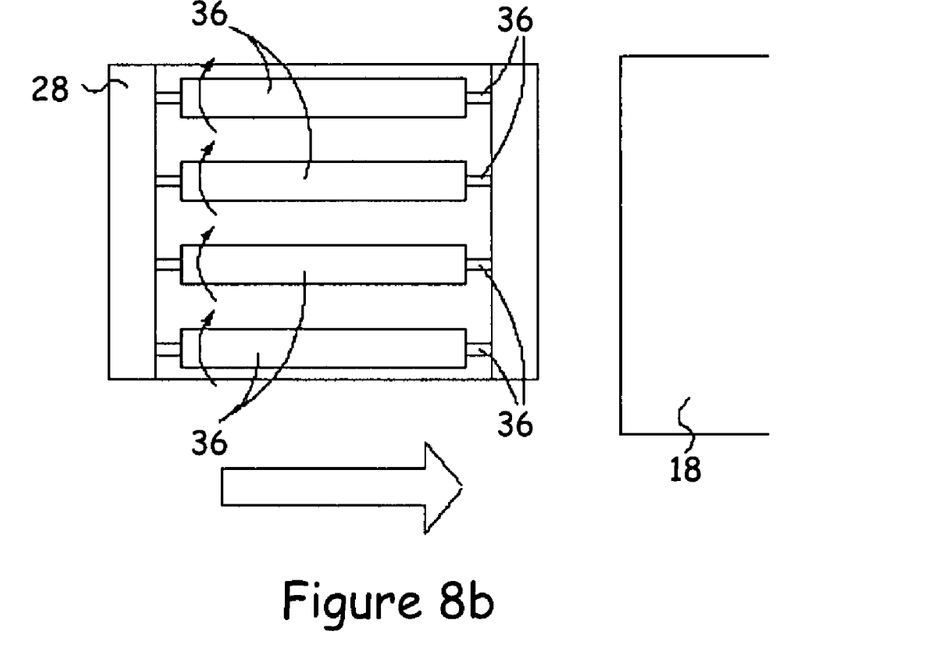
FIG. 8B shows an exemplary combination of rotation and translation of the non-planar substrates.

FIGS. 8A and 8B show exemplary rotation and translation combinations for the non-planar substrates 26 as they enter and move through the chamber 18. In some embodiments, the non-planar substrates 26 are rotating about their longitudinal axes via mandrels 36 fixed to the tray 28. In FIG. 8A, the non-planar substrates 26 translate through the chamber 18 lengthwise as they rotate. In FIG. 8B, the non-planar substrates 26 translate through the chamber 18 widthwise. In both exemplary embodiments, the non-planar substrates 26 rotate concurrently and/or simultaneously as they translate through the chamber 18.

Figure 9:
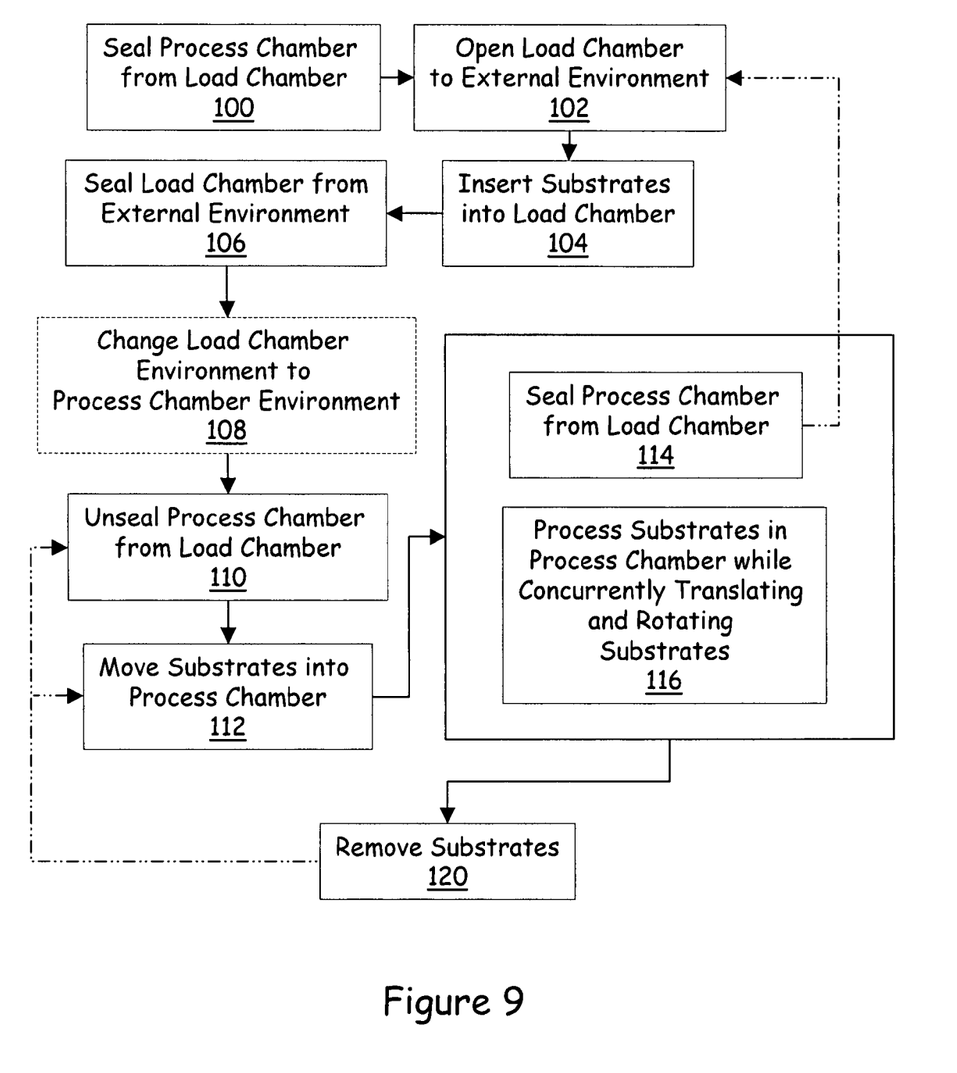
FIGS. 9, 10, and 11 are block diagrams of exemplary methods of operating an inline system for depositing material on a non-planar substrate.

FIG. 9 details an exemplary method to effectuate an inline deposition of semiconductor materials on elongated non-planar substrates. The process chamber is sealed from the load chamber in a step 100. The load chamber is opened to the external environment in a step 102, and the substrates are put into the load chamber in a step 104. The load chamber is sealed to the external environment in a step 106, and the environment within the load chamber can be changed in a step 108. In a step 110, the process chamber is unsealed from the load chamber and the substrates are moved into the process chamber in a step 112.

In the step 108, preferably the environment is changed to match the process chamber environment as closely as possible. However, it should be noted that in some cases, due to large differences in volumes, the environment within the load chamber need not necessarily be changed. This can happen when the addition of the environment of the load chamber may not have significant impact on the overall processing chamber environment. However, it should be noted that whether the environment is changed or not, the process chamber is at all times sealed and isolated from the external environment.

The load chamber is sealed from the process chamber in a step 114 and the substrates are processed while being translated and rotated in a step 116. It should be noted that the steps 114 and 116 can be performed concurrently. However, only after the process chamber is sealed from the load chamber in the step 114 should the load chamber be unsealed to the external environment in the step 102, albeit for another set of substrates.

In a step 120 the substrates are removed. It should be noted that the substrates are preferably removed in the step 120 prior to the repeat of placing new substrates into the process chamber in the steps 110 and 112. However, some inline systems may be able to concurrently support older substrates and have newer ones placed into it on a concurrent basis.

Figure 10:
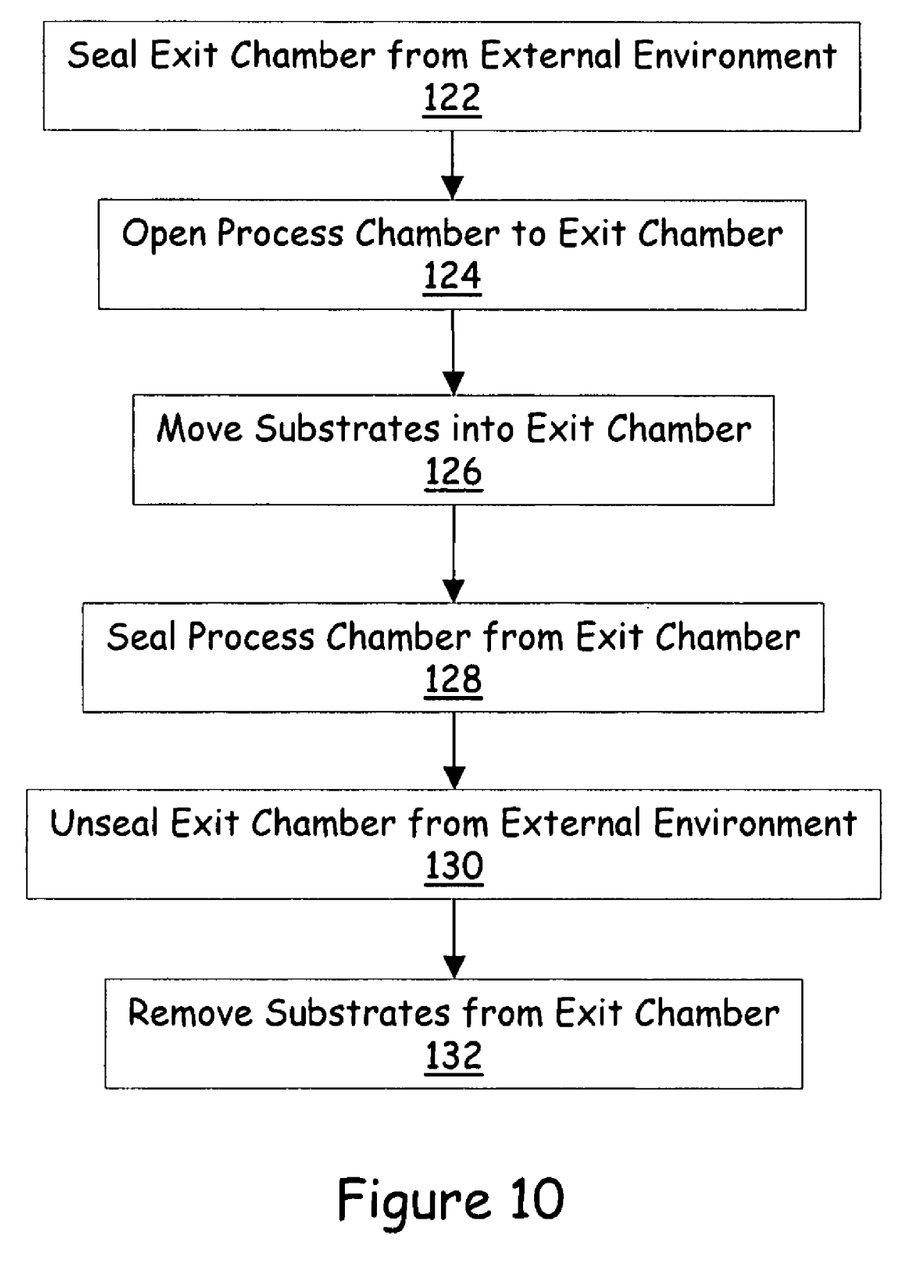

FIG. 10 is a flow diagram detailing an exemplary use of an exit chamber in an inline rotational system.

Figure 11:
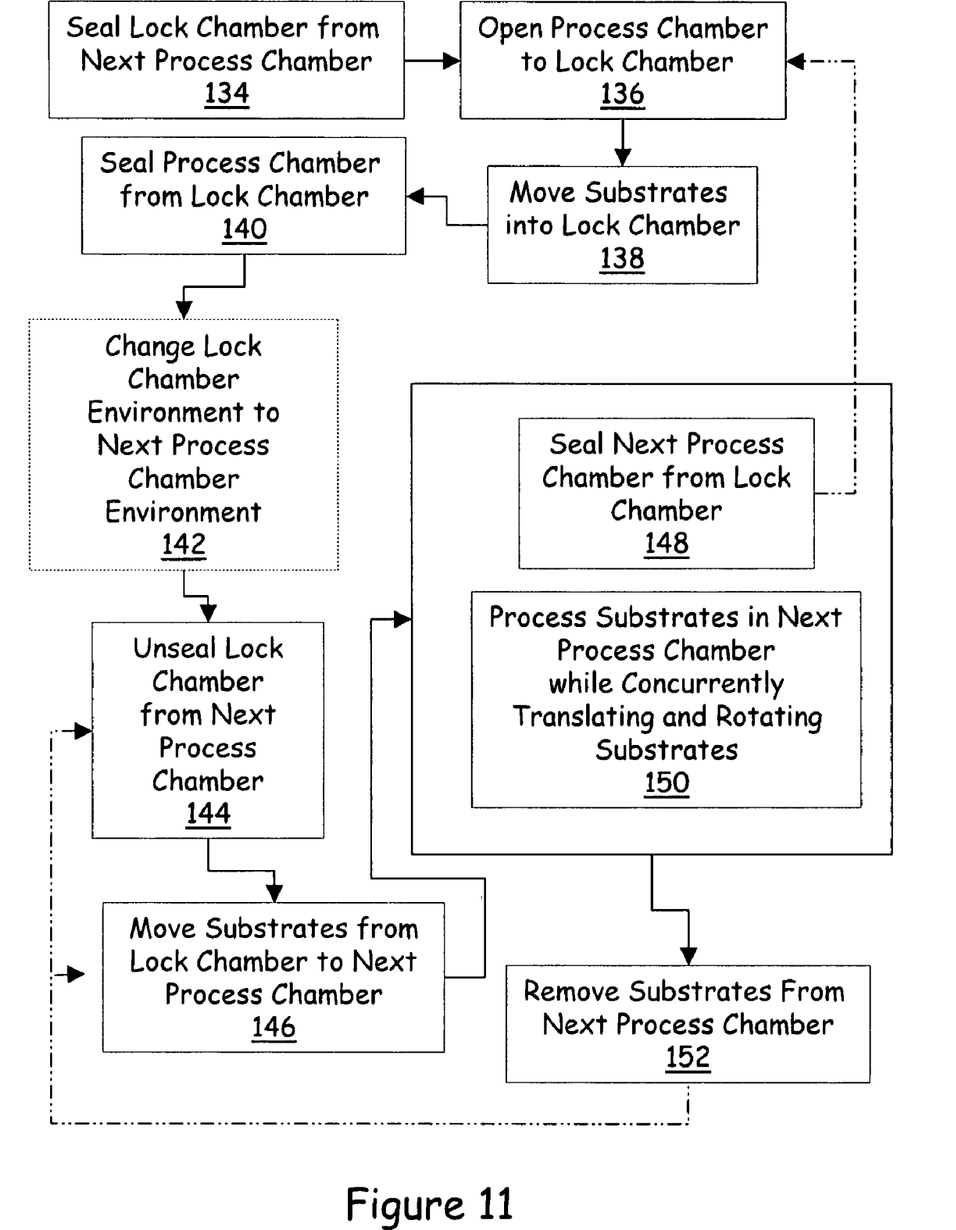

FIG. 11 details an exemplary method to effectuate an inline deposition of semiconductor materials on elongated non-planar substrates using an intermediate lock mechanism. The next process chamber is sealed from the lock chamber in a step 134. The lock chamber is opened to the previous process chamber in a step 136, and the substrates are put into the lock chamber in a step 138. The lock chamber is sealed to the previous process chamber in a step 140, and the environment within the lock chamber can be changed in a step 142. In a step 144, the next process chamber is unsealed from the lock chamber and the substrates are moved into the next process chamber in a step 146.

In the step 142, preferably the environment is changed to match the next process chamber environment as closely as possible. However, it should be noted that in some cases, due to large differences in volumes, the environment within the lock chamber need not necessarily be changed.

The lock chamber is sealed from the next process chamber in a step 148 and the substrates are processed while being translated and rotated in a step 150. It should be noted that the steps 148 and 150 can be performed concurrently. However, only after the process chamber is sealed from the lock chamber in the step 148 should the lock chamber be unsealed to the external environment in the step 136, albeit for another set of substrates.

In a step 152 the substrates are removed from the next process chamber. It should be noted that the substrates are preferably removed in the step 152 prior to the repeat of placing new substrates into the next process chamber in the steps 144 and 146. However, some inline systems may be able to concurrently have older substrates being removed while newer ones are still being processed. Further some inline systems may be able to concurrently have newer substrates being placed into the processing chamber while older ones are still being processed.

In operation, the present invention is can manufacture non-planar semiconductor devices by rotating non-planar substrates as they move down a translational path of a processing chamber. Rotational and translational movement can be effectuated by any known or convenient means, including, but not limited to a linear drive mechanism and a gear and pulley mechanism. The combination of rotational and translational motion provides for deposition of materials on the outer surface of the non-planar substrate during processing. Alternatively, such a rotational and translational processing system is able to be applied to powdercoating, chrome plating, or other metal plating. In semiconductor-related applications, a tubular substrate is able to be processed into a tubular, non-planar light emitting diode (LED). Further by way of example, a tubular substrate is able to be processed into a non-planar photovoltaic cell. Such a photovoltaic cell is able to have a greater surface area incidental to the sun's rays allowing for greater current generation.

It should be noted that the current description uses a tray to effectuate much of the transport functionality and substrate handling. While trays allow for ease of handling in industrial applications, this disclosure should not be construed as being limited to having trays. The translational and rotational aspects of substrate handling can be effectuated by mechanisms that are inherent to the processing machinery, and that are loaded singly with a substrate or in groups of multiple substrates. The load chamber, the lock chamber, and the exit chamber may all be configured to use such machine-based rotational and translational movement without the use of support trays, and this should be considered as being part of this disclosure.

A method and apparatus for manufacturing a semiconductor device on at least one substrate is envisioned. A first chamber having a first volume is provided. A first opening couples the first chamber to a first environment, and the first opening allows passage of the at least one substrate. A first sealing member is provided to establish an environmental seal between the first chamber and the first environment. A semiconductor process chamber, having a second volume with substantially a processing environment, is coupled to the first chamber through a second opening. The second opening allows passage of the at least one substrate is provided, and a second sealing member is provided to establish an environmental seal between the first chamber and the semiconductor process chamber. The first volume and the second volume are environmentally isolated from one another for a first time. The at least one substrate is placed within first volume from the first environment, and the first volume and the first environment are environmentally isolated. The second opening is opened, and the at least one substrate is moved into the semiconductor process chamber. For a second time, the first volume is environmentally isolated from the second volume. A semiconductor processing step is performed on the at least one substrate within the semiconductor processing chamber. While the semiconductor processing step is occurring, the at least one substrate is moved. The movement includes rotating the at least one substrate during the semiconductor step, and translating the at least one substrate through the processing chamber.

In one instance the second volume is larger than the first volume. The second volume can be greater than 1.5×, greater than 2×, greater than 3×, greater than 5×, greater than 10×, greater than 25×, greater than 50×, greater than 100×, greater than 250×, greater than 500×, greater than 1000×, or greater than 5000× the first volume. The semiconductor processing step can includes a deposition of a film of semiconductor material. The semiconductor processing step can be a physical vapor deposition, a chemical vapor deposition, a sputtering step, or a thermal evaporation step, among many other types of steps.

Concurrently with the performing the semiconductor processing step on the at least one substrate, at least one other substrate can be placed into the first chamber. after environmentally isolating the first volume from the second volume for the second time, the at least one other substrate can be placed into the first chamber.

In one instance, at least partially between the steps of environmentally isolating the first volume from the second volume the first and second times, the environment in the first volume can be altered to more closely match the processing environment. An environmental factor in the first volume may be altered, such as changing the pressure or adding a chemistry. Material can be removed material from the first volume. Material can be also be added material to the first volume, where the material is also found in the processing environment.

The processing chamber is can be a processing chamber in a series of coupled processing chambers. The processing chamber can be the first chamber in a series of coupled processing chambers. The first chamber can couple two processing chambers. The first chamber can couple a processing chamber and a lock chamber. The first chamber can be coupled between a processing chamber and a load chamber.

The substrate can be an elongated substrate. The substrate can be a tubular substrate. The one substrate can have at least one non-linear surface. The substrate can have at least one linear surface. The substrate can be a plurality of substrates attached to a load tray.

A method and apparatus for manufacturing a semiconductor device on a substrate can have a first chamber that defines a first volume. The first chamber has a first opening to a first environment that allows passage of at least a first substrate. A first sealing member may be utilized to establish an environmental seal on the first opening between the first chamber and the first environment.

A semiconductor processing step is performed on at least the first substrate within the semiconductor processing chamber. At a first time, the first volume environmentally isolated from the first environment. At a second time, the first volume is opened to the second volume. The at least first substrate can be moved from the second volume to the first volume. The first volume is then environmentally isolated from the second volume.

The first volume can then be opened to the first environment.

Concurrently with the step of performing the semiconductor processing step on the first substrate, the first substrate is moved. This can be accomplished by rotating the first substrate such that more than half of the total surface area of the first substrate is exposed to the semiconductor process. Further, the first substrate is translated through the processing chamber.

The second volume can be larger than the first volume. The ratios noted above can also apply to this, as can any number. In case the second volume is at least twice as large than the first volume.

In one instance, after opening the first volume to the first environment, the first volume can be isolated from the first environment. Subsequent to isolating the first volume from the first environment, the first volume environment can be altered to more closely match the environment within the second volume.

At a point, the first substrate can be removed from the first volume.

In one instance, between the second time and the fourth time, a semiconductor processing step can be performed on a second substrate that would already have been previously loaded. Concurrently with performing the semiconductor processing step on the second substrate, the second substrate can be moved. Such movement can include rotating the second substrate such that more than half of the total surface area of the second substrate is exposed to the semiconductor process, and concurrently with such rotation, translating at least the second substrate through the processing chamber.

An apparatus for manufacturing semiconductor devices can have a first chamber operable to accept a first substrate from among at least one substrate. A first aperture, associated with the first chamber, environmentally couples the first chamber to a first environment outside the first chamber. A first sealing member is provided that can reside in at least an open position and a closed position. The first sealing member closes the first aperture and isolates the first chamber environment from the first environment when in the closed position, and allows the first environment into the first chamber when in the open position. A processing chamber is provided to perform a semiconductor processing step on at least one substrate under a processing environment. The processing chamber has a first motion mechanism operable to move the substrate in a translational manner through the processing chamber. A second motion mechanism provides a rotation to the at least one substrate, and the first motion mechanism can operate concurrently with second motion mechanism.

A second aperture couples the first chamber and the processing chamber. A second sealing member is provided that resides in at least an open position and a closed position. The second sealing member shuts the second aperture and isolates the first chamber environment from the processing environment when in the closed position, and opens the second aperture and allows the first chamber environment into the processing chamber when in the open position.

In one instance, the first chamber has a substantially smaller volume than the processing chamber. The processing chamber can deposit of a film of semiconductor material on the at least one substrate. The processing chamber can perform a physical vapor deposition, a chemical vapor deposition, a sputtering process, or any other deposition-type operation on the substrate.

The first chamber can be coupled between the processing chamber and a second processing chamber. The first chamber can connects the processing chamber the second processing chamber. The first chamber can connect the processing chamber and a lock chamber. The first chamber can connect the processing chamber and an exit chamber. The first chamber can connect the processing chamber and a load chamber.

The first chamber can receive the at least one substrate when the semiconductor processing step is finished on the at least one substrate. The first chamber can receive the at least one substrate prior to the semiconductor processing step being performed on the at least one substrate.

The apparatus can concurrently: i) perform the semiconductor processing step on the at least one substrate; ii) have another substrate placed into the first chamber. The apparatus can concurrently perform a semiconductor processing step on the at least one substrate, while placing another substrate into the processing chamber.

The apparatus can have a mechanism for changing an environmental factor within the first chamber. The environmental factor can be pressure, temperature, or a chemistry.

The processing chamber can be a series of coupled processing chambers.

The substrate can be an elongated substrate. The substrate can be a tubular substrate. The substrate can include one non-linear surface. The substrate can includes at least one linear surface.

A method of semiconductor processing onto at least one substrate is envisioned. A semiconductor substrate is provided. The substrate has a total surface area comprising either: a) a plurality of interlinked surface characteristics; or b) an omnifacial surface characteristic.

A semiconductor process chamber defining a first volume is provided. A preliminary chamber, having a first opening to an external environment and a second opening to the semiconductor process chamber is also provided. The first opening and the second opening each provide an environmental seal, and are operable to allow passage of the least one substrate. The preliminary chamber defines a second volume, where the second volume is no more than 25% of the first volume. The first volume is environmentally isolated from the second volume, and the substrate is placed the within second volume from the external environment. The second volume is environmentally isolated from the external environment. The environment in the second volume is changed to substantially match the environment within the first volume. The at least one substrate is moved into the semiconductor process chamber, and the first volume is environmentally isolated from the second volume.

A semiconductor processing step is performed on the substrate within the semiconductor processing chamber. Semiconductor source material is provided, where the semiconductor source material is introduced into the semiconductor processing chamber and at least in part concurrently removed from the semiconductor processing chamber.

The at least one substrate is also moved in the semiconductor process chamber. The step of moving includes rotating the at least one substrate such that more than half of the total surface area of the at least one substrate is exposed to the semiconductor process. The steps of moving and providing the semiconductor source material occur at least in part concurrently with one another.

The present application has been described in terms of specific embodiments incorporating details to facilitate the understanding of the principles deposition of materials on a non-planar surface. Many of the components shown and described in the various figures are able to be interchanged to achieve the results necessary, and this description should be read to encompass such interchange as well. As such, references herein to specific embodiments and details thereof are not intended to limit the scope of the claims appended hereto.

I claim:

1. A method of semiconductor processing onto at least one substrate, the method comprising:
    providing at least one semiconductor substrate, the at least one substrate having a total surface area, the total surface area comprising either:
    a. a plurality of interlinked surface characteristics; or
    b. an omnifacial surface characteristic;
    providing a semiconductor process chamber, the semiconductor process chamber defining a first volume;
    providing a preliminary chamber, having a first opening to an external environment and a second opening to the semiconductor process chamber, the first opening and the second opening each operable to provide an environmental seal, the first opening and the second opening operable to allow passage of the least one substrate, the preliminary chamber defining a second volume, the second volume being no more than 25% of the first volume;

environmentally isolating the first volume from the second volume;
placing the at least one substrate within second volume from the external environment;
environmentally isolating the second volume from the external environment;
changing the environment in the second volume to substantially match the environment within the first volume;
moving the at least one substrate into the semiconductor process chamber;
environmentally isolating the first volume from the second volume;
performing a semiconductor processing step on the substrate within the semiconductor processing chamber, the step of performing the semiconductor processing step including:
providing a semiconductor source material, the step of providing including:
introducing a semiconductor source material into the semiconductor processing chamber;
removing the semiconductor source material from the semiconductor processing chamber;
the steps of introducing and removing the semiconductor source material occurring at least in part concurrently with one another;
moving the at least substrate in the semiconductor process chamber, the step of moving including:
rotating the at least one substrate such that more than half of the total surface area of the at least one substrate is coated by the semiconductor process;
the steps of moving the at least one substrate and providing the semiconductor source material occurring at least in part concurrently with one another.

2. The method of claim 1 wherein the semiconductor processing step includes a deposition of a film of semiconductor material.

3. The method of claim 1 wherein the semiconductor processing step comprises a physical vapor deposition.

4. The method of claim 1 wherein the semiconductor processing step comprises a chemical vapor deposition.

5. The method of claim 1 wherein the semiconductor processing step comprises a sputtering step.

6. The method of claim 1 wherein the semiconductor processing step comprises a thermal evaporation step.

7. The method of claim 1 further comprising the step of:
concurrently with the step of performing a semiconductor processing step on the at least one substrate, placing at least one other substrate into the preliminary chamber.

8. The method of claim 1 further comprising the step of:
after the step of environmentally isolating the first volume from the second volume, placing at least one other substrate into the preliminary chamber.

9. The method of claim 1 further comprising the step of, at least partially between the step of a) environmentally isolating the first volume from the second volume; and b) environmentally isolating the first volume from the external environment, changing the environment in the first volume to more closely match a processing environment.

10. The method of claim 1 further comprising the step of, at least partially between the step of a) environmentally isolating the first volume from the second volume; and b) environmentally isolating the first volume from the external environment, changing an environmental factor in the first volume.

11. The method of claim 10 wherein the step of changing an environmental factor in the first volume comprises changing the pressure.

12. The method of claim 10 wherein the step of changing an environmental factor in the first volume comprises changing the temperature.

13. The method of claim 10 wherein the step of changing an environmental factor in the first volume comprises adding a chemistry.

14. The method of claim 10 wherein the step of changing an environmental factor in the first volume comprises removing material from the first volume.

15. The method of claim 10 wherein the step of changing an environmental factor in the first volume comprises adding material to the first volume, the material comprising material existing within a processing environment.

16. The method of claim 1 wherein the semiconductor process chamber is a processing chamber in a series of coupled processing chambers.

17. The method of claim 16 wherein the semiconductor process chamber is the first chamber in a series of coupled processing chambers.

18. The method of claim 1 wherein the preliminary chamber couples two processing chambers.

19. The method of claim 1 wherein the preliminary chamber is coupled between a processing chamber and a lock chamber.

20. The method of claim 1 wherein the preliminary chamber is coupled between a processing chamber and a load chamber.

21. The method of claim 1 wherein the at least one substrate includes at least one elongated substrate.

22. The method of claim 1 wherein the at least one substrate includes at least one tubular substrate.

23. The method of claim 1 wherein the at least one substrate includes at least one non-linear surface.

24. The method of claim 1 wherein the at least one substrate includes at least one linear surface.

25. The method of claim 1 wherein the at least one substrate comprises a plurality of substrates attached to a load tray.

26. A method of semiconductor processing onto a substrate, comprising:
providing at least one semiconductor substrate, the at least one substrate having a total surface area, the total surface area comprising either:
a plurality of interlinked surface characteristics; or
an omnifacial surface characteristic;
providing a semiconductor process chamber, the semiconductor process chamber defining a first volume;
moving the at least one substrate into the semiconductor process chamber;
performing a semiconductor processing step on the substrate within the semiconductor processing chamber, the step of performing the semiconductor processing step including:
providing a semiconductor source material stream, further including:
introducing a semiconductor source material into the semiconductor processing chamber;
removing the semiconductor source material from the semiconductor processing chamber;
the steps of introducing and removing the semiconductor source material occurring at least in part concurrently with one another;
moving the at least substrate in the semiconductor process chamber, including:
rotating the at least one substrate such that more than half of the total surface area of the at least one substrate is coated by the semiconductor process material stream;

the steps of moving the at least one substrate and providing the semiconductor source material occurring at least in part concurrently with one another.

27. The method of claim 26 wherein the semiconductor processing step includes a deposition of a film of semiconductor material.

28. The method of claim 26 wherein the semiconductor processing step comprises a physical vapor deposition.

29. The method of claim 26 wherein the semiconductor processing step comprises a chemical vapor deposition.

30. The method of claim 26 wherein the semiconductor processing step comprises a sputtering step.

31. The method of claim 26 wherein the semiconductor processing step comprises a thermal evaporation step.

32. The method of claim 26 further comprising the step of:
concurrently with the step of performing a semiconductor processing step on the at least one substrate, placing at least one other substrate into the semiconductor process chamber.

33. The method of claim 26 further comprising the step of changing an environmental factor in the first volume.

34. The method of claim 33 wherein the step of changing an environmental factor in the first volume comprises changing a pressure.

35. The method of claim 33 wherein the step of changing an environmental factor in the first volume comprises changing a temperature.

36. The method of claim 33 wherein the step of changing an environmental factor in the first volume comprises adding a chemistry.

37. The method of claim 33 wherein the step of changing an environmental factor in the first volume comprises removing material from the first volume.

38. The method of claim 33 wherein the step of changing an environmental factor in the first volume comprises adding material to the first volume, the material comprising material existing within a processing environment.

39. The method of claim 26 wherein the processing chamber is a processing chamber in a series of coupled processing chambers.

40. The method of claim 39 wherein the semiconductor process chamber is the first chamber in a series of coupled processing chambers.

41. The method of claim 26 wherein the semiconductor process chamber couples two processing chambers.

42. The method of claim 26 wherein the semiconductor process chamber is coupled between a processing chamber and a lock chamber.

43. The method of claim 26 wherein the semiconductor process chamber is coupled between a processing chamber and a load chamber.

44. The method of claim 26 wherein the at least one substrate includes at least one elongated substrate.

45. The method of claim 26 wherein the at least one substrate includes at least one tubular substrate.

46. The method of claim 26 wherein the at least one substrate includes at least one non-linear surface.

47. The method of claim 26 wherein the at least one substrate includes at least one linear surface.

48. The method of claim 26 wherein the at least one substrate comprises a plurality of substrates attached to a load tray.

* * * * *